(12) United States Patent
Ning

(10) Patent No.: US 6,780,775 B2
(45) Date of Patent: Aug. 24, 2004

(54) DESIGN OF LITHOGRAPHY ALIGNMENT AND OVERLAY MEASUREMENT MARKS ON CMP FINISHED DAMASCENE SURFACE

(75) Inventor: Xian J. Ning, Mohegan Lake, NY (US)

(73) Assignee: Infineon Technologies AG, Munich (DE)

( * ) Notice: Subject to any disclaimer, the term of this patent is extended or adjusted under 35 U.S.C. 154(b) by 392 days.

(21) Appl. No.: 09/854,760

(22) Filed: May 14, 2001

(65) Prior Publication Data

US 2002/0098707 A1 Jul. 25, 2002

Related U.S. Application Data

(60) Provisional application No. 60/263,968, filed on Jan. 24, 2001.

(51) Int. Cl.[7] .............................................. H01L 21/302
(52) U.S. Cl. ....................... 438/706; 438/401; 438/691; 438/692; 438/700; 438/706; 438/720
(58) Field of Search ................................. 438/691, 692, 438/700, 706, 710, 712, 720, 401

(56) References Cited

U.S. PATENT DOCUMENTS 6,174,737 B1 * 1/2001 Durlam et al. .................. 438/3
6,183,614 B1 * 2/2001 Fu ........................... 204/298.2
6,346,454 B1 * 2/2002 Sung et al. ................. 438/396

OTHER PUBLICATIONS

Chi–Tzung Wang. et al., Pad Wear Analysis in CMP; 1999 VMIC Conference: 1999 IMIC 109/99/0267(c).
Srini Raghavan, et al., Elecrochemical Behavior of Copper and Tantalum in Silica Containing Hydroxylamine. 1999 VMIC Conference: 1999 IMIC 109/99/0619(c).
Rajeev Bajaj. et al. Manufacturability Considerations and Approaches for Development of a Copper CMP Process: 1999 VMIC Conference: 1999 IMIC 109/99/0144(c).

* cited by examiner

*Primary Examiner*—Lan Vinh
(74) *Attorney, Agent, or Firm*—Slater & Matsil, L.L.

(57) ABSTRACT

A method for producing a semiconductor device having an alignment mark, the method comprising forming a first dielectric layer within which a trench having predetermined dimensions is etched and depositing a first layer of metal into the trench; forming a second dielectric layer over the first dielectric layer and over the first layer of metal; simultaneously etching lines and an opening into the second dielectric layer, at least one line used as a via extending to the first layer of metal; filling the lines and the opening, the filling controlled to fill the lines and to under fill the opening; performing chemical mechanical polishing of the plate; and depositing a non-transparent stack of layers onto the metal, whereby the non-transparent stack of layers conforms to the surface of the under filled opening resulting in an alignment mark on the non-transparent stack of layers in order to align successive layers.

16 Claims, 5 Drawing Sheets

DESIGN OF LITHOGRAPHY ALIGNMENT AND OVERLAY MEASUREMENT MARKS ON CMP FINISHED DAMASCENE SURFACE

This application claims benefit to U.S. Provisional Application 60/263,968, filed Jan. 24, 2001.

TECHNICAL FIELD

This invention relates generally to lithographic processing of semiconductor devices and more particularly to a structure for lithographic alignment and a method for producing the same in a semiconductor process involving non-transparent layers.

BACKGROUND OF THE INVENTION

Semiconductor devices are continually becoming smaller in size and require manufacturing processes that are capable of producing these devices. Alignment techniques are implemented during manufacturing processes to ensure correct alignment of the various layers within semiconductor devices. Typically, alignment marks are utilized in the layers to help align the various features.

Magnetoresistive random access memory (MRAM) devices are typically processed using structures upon which are formed magnetic metal stacks. The magnetic stack consists of many different layers of metals and a thin layer of dielectric with a total thickness of a few tens of nanometers. The magnetic devices are built on top of the copper channels embedded in the inter-level dielectric (ILD) material. Since this stack is non-transparent to light, the lithography on top of this layer requires topographic features for alignment and overlay measurement marks on the layer. Typically this underlying layer has a chemical mechanical polish (CMP) finish. Forming the alignment marks is usually done by additional lithography and reactive ion etch (RIE) steps to generate marks on the CMP finished surface that exposes the copper and dielectric patterns. Additional RIE and subsequent clean steps boost cost and increase the chances of creating particles on the CMP finished level, however.

SUMMARY OF THE INVENTION

These and other problems are generally solved or circumvented, and technical advantages are generally achieved, by the present invention.

In a preferred embodiment structure of the present invention, the structure for alignment comprises a first metal layer having a top surface at a distance x below a top of the structure and a second metal layer extending from the top of the structure to a distance y below the top of the structure wherein the distance y is less than the distance x. A via is utilized to connect the first metal layer and the second metal layer. For alignment purposes, an alignment mark extending from the top of the structure to a depth of at least x is included. A non-transparent stack layer is deposited above the top of the structure with the stack layer conforming to the shape of the alignment mark whereby the alignment mark is visually recognizable.

A preferred method for producing a semiconductor device having and using an alignment mark comprises forming a first dielectric layer, etching a trench having predetermined dimensions into the dielectric layer, and depositing a first layer of metal into the trench. A second dielectric layer is formed over the first dielectric layer and over the first layer of metal and channels are etched into the second dielectric layer, at least one channel is used as a via extending to the first layer of metal. An opening is etched simultaneously with the channels into the second dielectric layer such that the opening extends through the second dielectric layer whereby a bottom surface of the opening is coplanar to a top surface of the first metal layer. The channels and the opening are filled and a remaining portion of the surface of the second dielectric layer is plated with metal. The filling step is controlled to fill the channels and to under fill the opening. Chemical mechanical polishing of the plate provides a planar surface on which a non-transparent stack of layers can be deposited. The non-transparent stack of layers conforms to the surface of the under filled opening during deposition of the non-transparent stack of layers resulting in an alignment mark on the non-transparent stack of layers.

One advantage of a preferred embodiment of the present invention is that it does not require additional RIE and subsequent clean steps that are costly and increase the chances of creating particles on the surfaces.

Another advantage of a preferred embodiment of the present invention is that the alignment of lithography on top of the non-transparent layer is made directly to the underneath metal layer. This reduces the overlay inaccuracy of introducing intermediate alignment marks that align to the metal and is then used as a reference to align the lithography on top of the non-transparent layer.

Another advantage of a preferred embodiment of the present invention is that the alignment mark does not take out additional space on the structure. Typically, additional lithography and etch steps would be needed to generate a new set of alignment marks that would require additional space on the chip.

A further advantage of a preferred embodiment of the present invention is that it decreases the chances of the metal becoming oxidized when it is exposed in the additional RIE steps.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the concepts and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indi-

DETAILED DESCRIPTION OF PREFERRED EMBODIMENTS

The making and using of the presently preferred embodiment is discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention provides, for example, a method of producing an alignment mark that helps align features in the various layers of a semiconductor device during processing. Preferred embodiments of the invention allow for transfer of the previous level alignment mark directly into the magnetic stack layer without additional process steps. Although the present invention will be discussed in the context of MRAM and metal-insulator-metal capacitor (MIMCAP) applications, it should be appreciated by those skilled in the art that the present invention may be utilized in other applications.

Figure 1A:
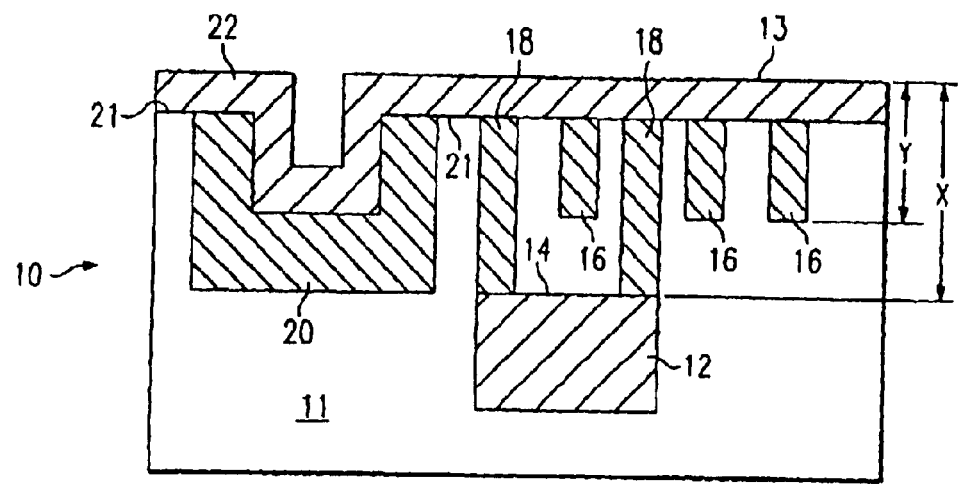
FIGS. 1a and 1b illustrate a preferred embodiment structure of the present invention.

FIG. 1a illustrates a preferred embodiment structure 10 of the present invention. The structure 10 comprises a substrate 11 and a first metal layer 12 formed in the substrate 11 having a top surface 14 at a distance x below a top 13 of the structure 10. A second metal layer 16 is also formed in the substrate 11 and extends from the top of the structure 10 to a distance y below the top 13 of the structure 10. The distance y is less than the distance x. Vias 18 are formed connecting the first metal layer 12 and the second metal layer 16. The first and second metal layers 12,16 may be comprised of, but not limited to, copper, tungsten, aluminum, or some combination thereof. Alignment of the various layers in the structure 10 is important to ensure that pattern features within the layers align to form an operable semiconductor device. Thus, an alignment mark 20 extending from the top 13 of the structure 10 to a depth of at least x is included for alignment of a non-transparent magnetic stack layer 22. The width of the alignment mark 20 is determined by the specific stepper or scanner used for lithography but the alignment mark 20 will generally have a width that is at least twice the depth of the alignment mark 20. This properly allows the alignment mark 20 to be under filled during processing as described below. The non-transparent magnetic stack layer 22 is located above the alignment mark 20, second metal layer 16, vias 18, and exposed portions of a surface 21 of the substrate 11. The non-transparent magnetic stack layer 22 conforms to the shape of the alignment mark 20 whereby the alignment mark 20 is visibly recognizable. One skilled in the art will recognize that structure 10, as illustrated, is an intermediate step in processing a finished product.

Figure 1B:
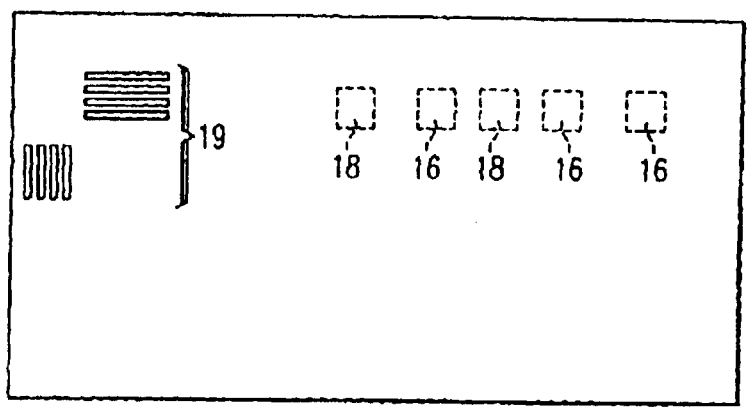

FIG. 1b illustrates a preferred embodiment alignment mark 19, shown in plan view. The mark comprises two series of parallel channels that form a light diffracting grating. The grating can have, for example, a periodicity of 8 um. The alignment mark 19 can be used to align subsequent layers with the second layer of metal 16 and vias 18 to form the proper connection of features in the structure 10. Grating marks usually have two sets of channels aligned orthogonal to each other. These types of marks are most often used as fine alignment marks, because they have fixed periodicity and are not sensitive to the line width variation cause by process instability. Hence they can always be used as the alignment reference no mater what the actual width of the channels. On the other hand, other types of structures, particularly box-to-box structures, are normally used to check the accuracy of the alignment after the pattern is exposed.

Figure 2A:
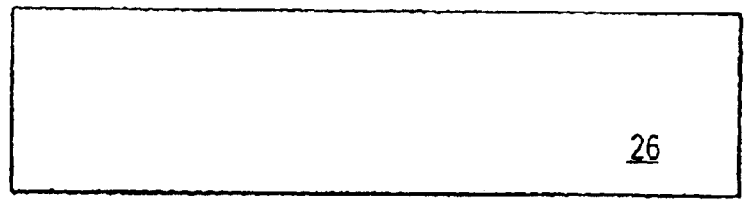
FIGS. 2a–2k illustrate a preferred embodiment method of the present invention.
Figure 2B:
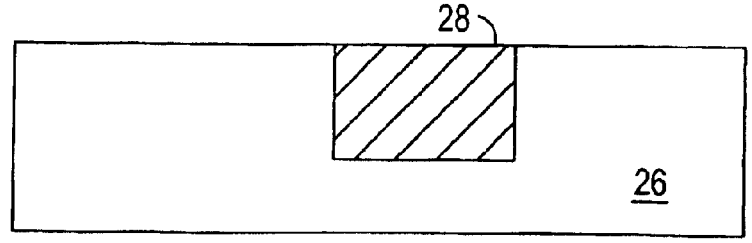
Figure 2C:
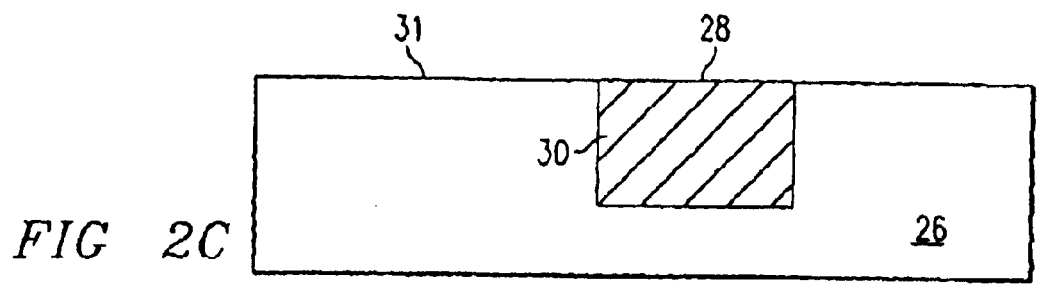
Figure 2D:
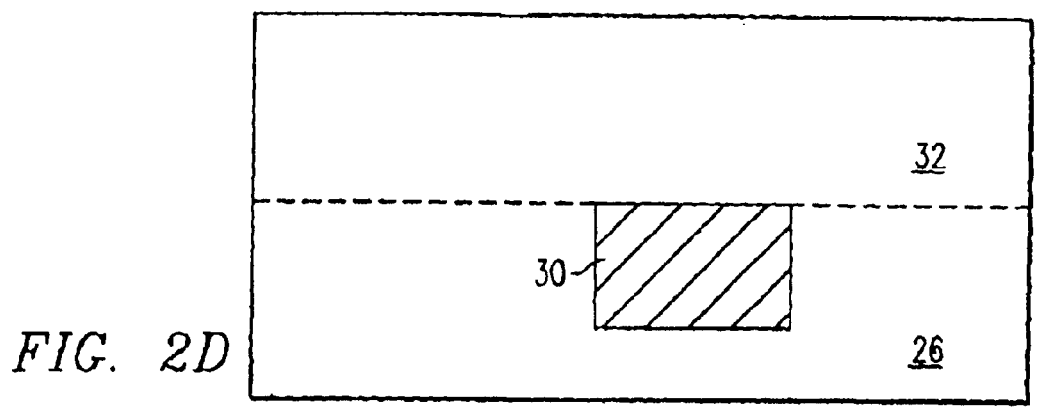
Figure 2E:
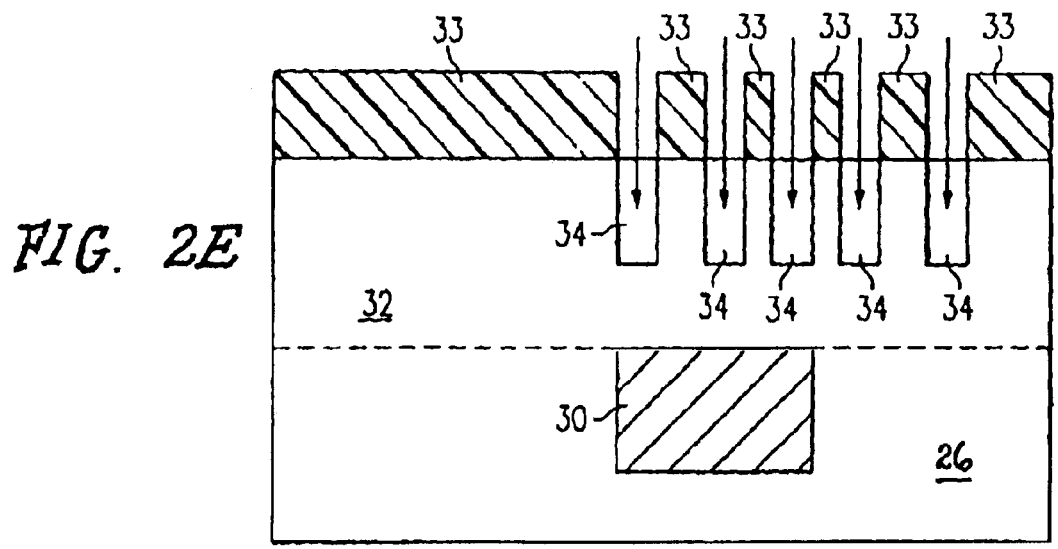

FIGS. 2a–2k illustrate a preferred embodiment method of the present invention. FIG. 2a begins the process where a first dielectric layer 26 is formed atop a semiconductor substrate (not shown). The first dielectric layer 26 may comprise, preferably, silicon dioxide, SILK, or fluorinated oxide, for example. A trench 28 together with the metal wiring structures is then etched into the first dielectric layer 26 (illustrated in FIG. 2b) and filled with a first layer of metal 30 as shown in FIG. 2c. Chemical mechanical polishing may be used to planarize a top surface 31 of the first dielectric layer 26 and the first layer of metal 30. As shown in FIG. 2d, once the first layer of metal 30 has been co-planned with dielectric layer 26, a second dielectric layer 32 is formed over the first dielectric layer 26 and over the first layer of metal 30. The second dielectric layer 32 may also comprise silicon dioxide, SILK, or fluorinated oxide, for example. The first and second dielectric layers 26, 32 are preferably about 9000 angstroms. Channels 34 are then etched into the second dielectric layer 32 using, for example, a photoresist layer 33 as a mask which has been patterned using a phototmask as shown in FIG. 2e. The channels 34 can serve as line features which operate as a second layer of metal.

Figure 2F:
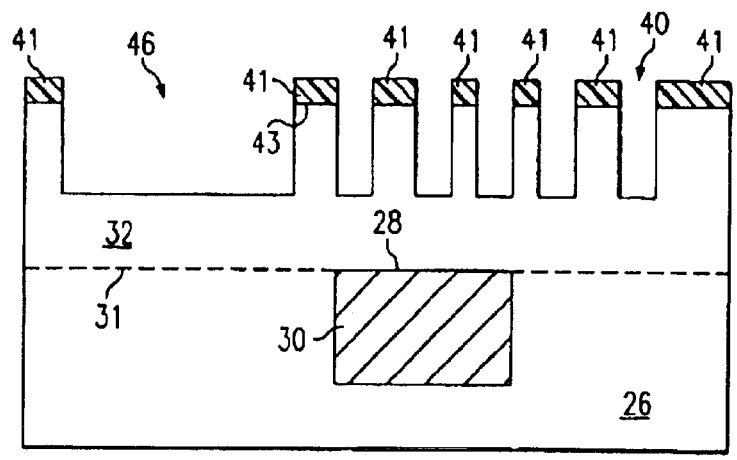
Figure 2G:
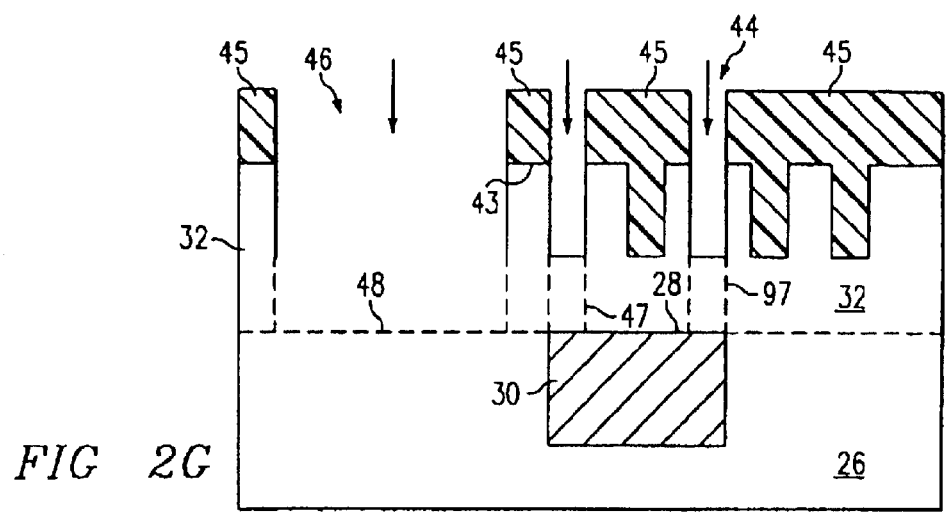
Figure 4:
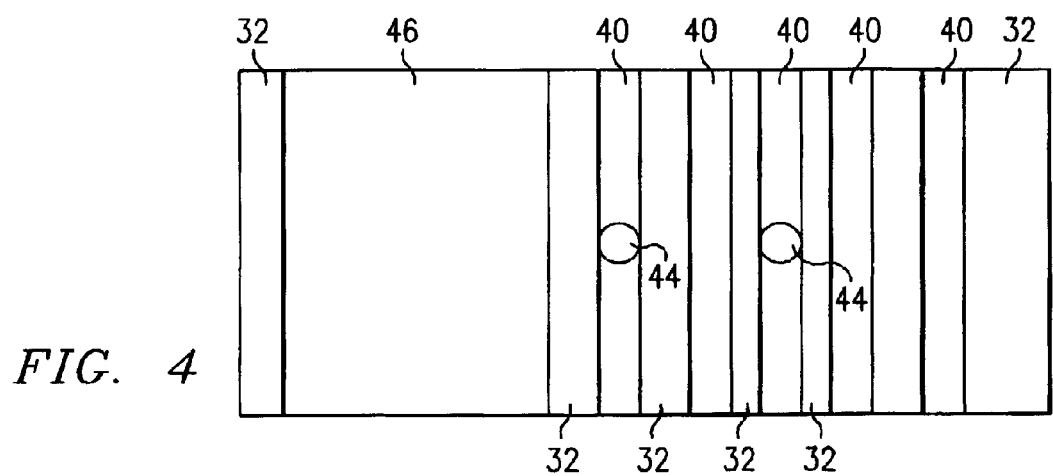
FIG. 4 illustrates a top view of a preferred embodiment structure of the present invention during processing.

One preferred embodiment, where the dual-damascene structures are formed in a two-step process, is shown in FIGS. 2f and 2g. As illustrated in FIG. 2f, first channels 40 and an opening 46 are etched, utilizing a first photoresist layer 41, to extend from a top surface 43 of the second dielectric layer 32 down to a pre-determined depth d which is smaller than the depth coplanar to the top surface 31 of the first dielectric layer 26 (indicated by dashed line). The depth d represents the thickness of the second layer of metal that will be formed in the first channels 40. In the second step, as illustrated in FIG. 2g, second channels 44 and an opening 46 are etched simultaneously by using a second photoresist layer 45 as etch mask. The second photoresist layer 45 allows the portion of first channels 40 that are to be used as vias to be extended, as indicated by the dashed lines 47, but prevents those first channels 40 to be used as a second layer of metal from being extended. The second channels 44 extend from the top surface 43 of the second dielectric layer 32 down to the first metal layer 30 in the first dielectric layer 26. A top view schematic is shown in FIG. 4 in which the second channels 44 are shown as circular channels. Furthermore, the opening 46 extends through the second dielectric layer 32 whereby a bottom surface 48 of the opening 46 is coplanar to or deeper than the top surface 28 of the first layer of metal 30. The two-step process results in the device as pictured in FIG. 2h. Once first and second channels 40, 44 and opening 46 have been etched as described above, an alignment mark that consists of array of openings 46 with desired periodicity can be formed in the second layer of metal. The first and second channels 40 and 44, respectively, and the opening 46 are filled with metal 50. The filling of the first and second channels 40, 44 and the opening 46 result in remaining portions of the top surface 43 of the second dielectric layer 32 being plated with the metal 50 in a region R, as shown in FIG. 2i. The metal 50 may be aluminum or tungsten, but is preferably copper and is about 7500 to about 8500 angstroms thick. The filling step may comprise depositing a liner layer (not shown) into the first and second channels 40 and 44, respectively, and opening 46 and then depositing the metal 50 onto the liner layer.

The opening 46 has pre-determined dimensions and patterns, as stated above, which are derived based on the type of lithography equipment used. However, the width of the opening 46 is generally greater than twice the depth of the opening 46 and is generally in the range between about two to about six micron meters. The dimension of first and second channels 40 and 44 are varies depend on the application and are generally about 0.2 to 2 micron meters. The channels 40 and 44 should be filled while the opening 46 is under-filled such that successive layers, in this case a non-transparent stack layer 58, have a visible indention at the location of the opening 46. This visible indentation will take the form of the grating 19 illustrated in FIG. 1b. However, before successive layers can be deposited, chemical mechanical polishing (CMP) is performed to planarize the metal 50 that is filling first and second channels 40 and 44, respectively, opening 46 and remaining portions of the top surface 43. The chemical mechanical polishing results in the device as illustrated in FIG. 2j. CMP removes the portion of the metal 50 that resides in the region R (shown in FIG. 2i). Note that because of the width of the opening 46 and the resulting under-filling, this feature remains non-planar, even after the CMP step. As illustrated in FIG. 2k, once the polishing is completed, a non-transparent stack of layers 58 is deposited atop the remaining metal 50 and the remaining portions of the top surface 43 of the second dielectric layer 32 whereby the non-transparent stack of layers 58 conforms to the shape of the under-filled opening 46. An alignment mark 60 results that is visible on the non-transparent stack of layers 58.

Figure 3A:
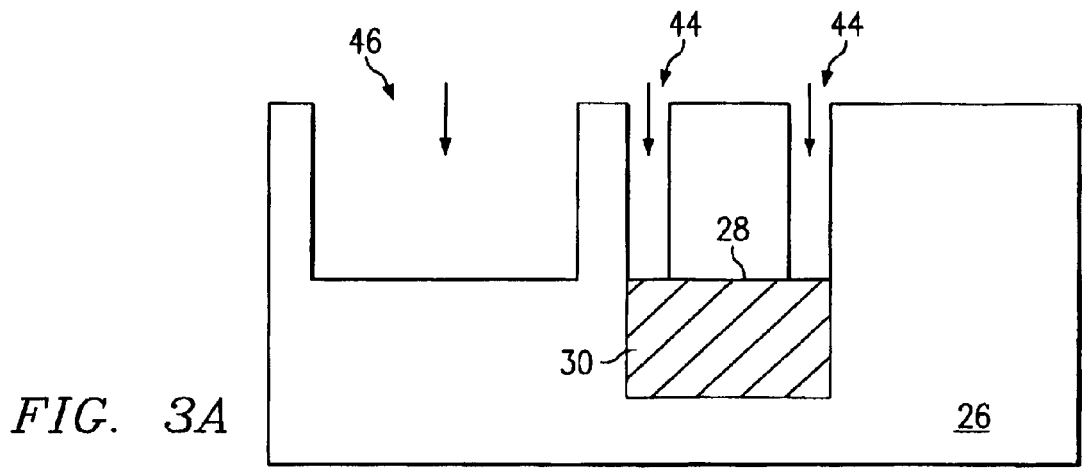
FIGS. 3a and 3b illustrate another preferred embodiment method of the present invention.
Figure 3B:
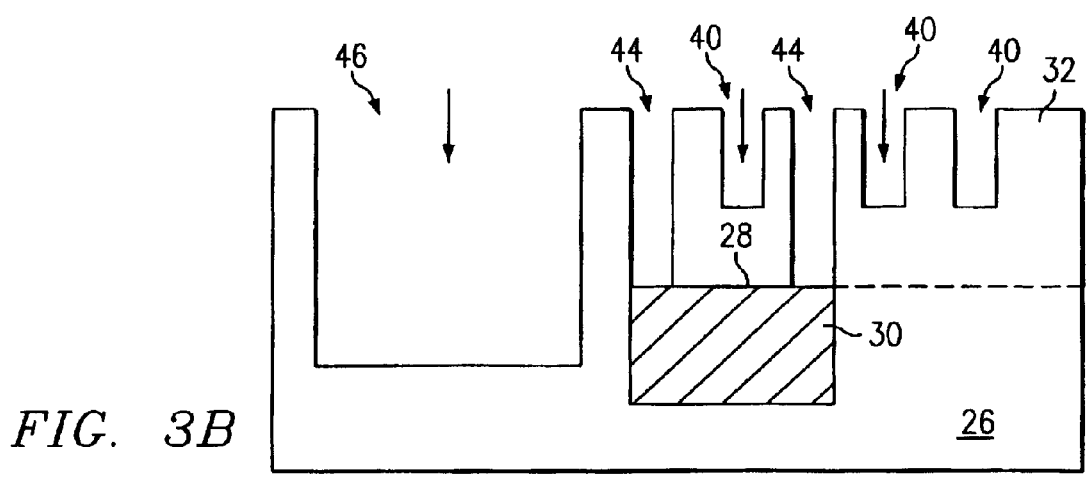

In yet another embodiment method where the dual-damascene structures are formed by lithographic patterning and etch, the second channels 44 that serve as vias are formed first followed by lithographic patterning and etch of the first channels 40 that serve as the second layer of metal. This is illustrated in FIG. 3a. The second channels 44 and opening 46 are etched to a depth of total thickness of layer 32, i.e., to reach the surface of first layer of metal 30. The first channels 40 that will serve as the second layer of metal are then lithographically patterned so that the second channels 44 are protected by the photoresist and etched in the second step of the process illustrated in FIG. 3b. It is optional in this lithographic patterning to expose the opening 46 or protect it. In the situation where the metal plating thickness is high, the requirement of the depth of the opening 46 would be greater, in order to have a surface topography. In this case, the lithography for first channels 40 would leave the opening 46 unprotected by resist. Hence the final depth of the opening 46 after line etch would be the sum of depth d plus via depth as shown FIG. 3b.

Figure 2H:
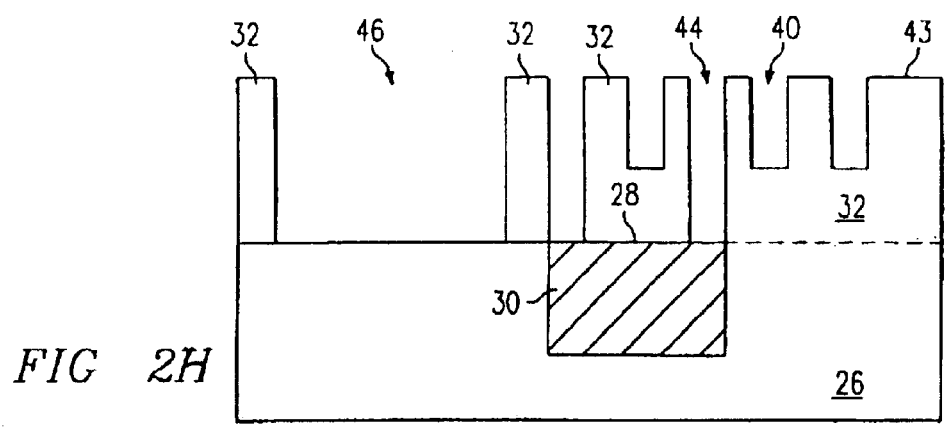
Figure 2I:
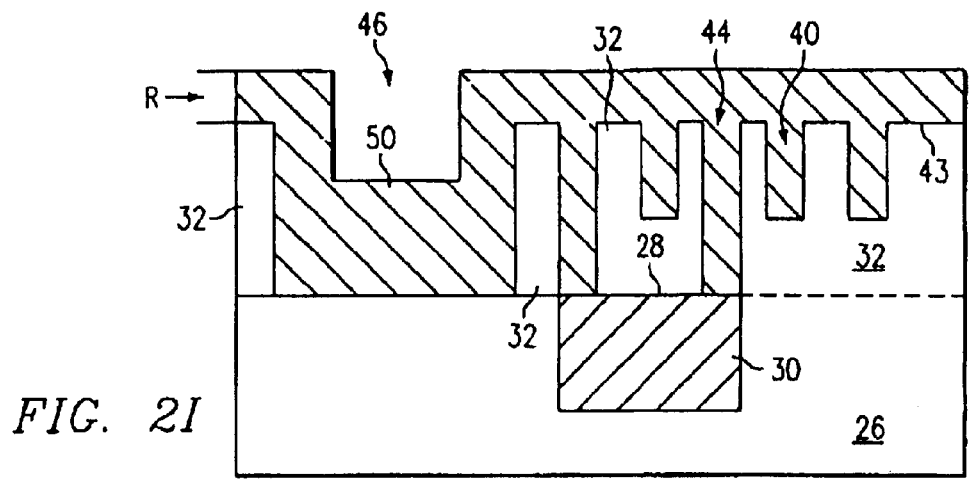
Figure 2J:
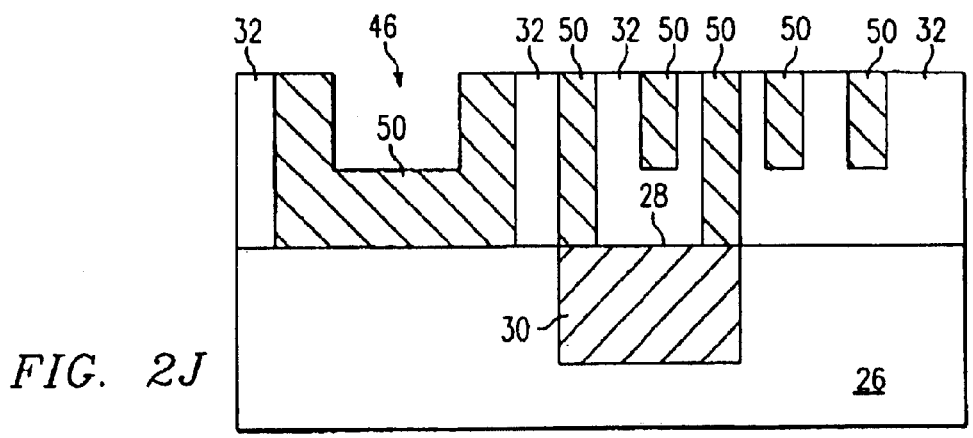
Figure 2K:
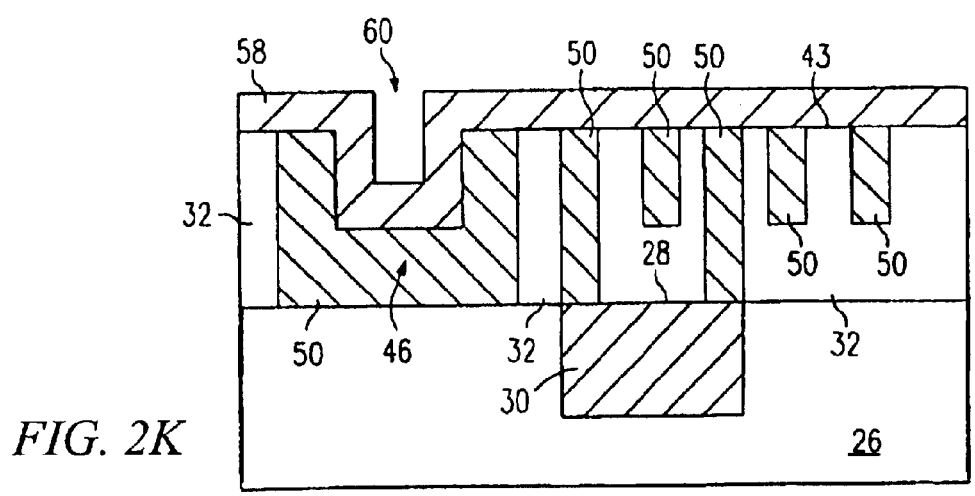

On the other hand, the lithographic patterning process of first channels 40 can leave the opening 46 protected and hence result in the depth of opening 46 same as that in FIG. 2h. In any of the embodiments the process of forming vias, the second layer of metal, and opening 46 is a two-step process. It should be appreciated, however, that the process of forming the vias, second layer of metal, and opening 46 may include any number of steps.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, manufacture, means, methods and steps described in the specification. Accordingly, the appended claims are intended to include within their scope such processes, manufacture, means, methods, or steps.

What is claimed is:

1. A method for producing a semiconductor device having an alignment mark, the method comprising the steps of:

forming a first dielectric layer;

etching a trench having predetermined dimensions into the dielectric layer;

depositing a first layer of metal into the trench;

forming a second dielectric layer over the first dielectric layer and over the first layer of metal;

depositing a first resist layer over said second dielectric layer;

patterning said first resist layer to define a first multiplicity of apertures and an array of openings, said array of openings having a predetermined periodicity and each opening having a selected width;

etching, simultaneously, said first multiplicity of apertures and said array of openings into the second dielectric layer a first distance;

depositing a second resist layer over said etched second dielectric layer;

patterning said second resist layer to define a second multiplicity of apertures;

etching said second multiplicity of apertures a second distance;

filling the apertures and the array of openings with a metal, the filling step controlled to fill the channels and under fill the array of openings, said selected width of said openings being at least two times the depth of said openings;

performing chemical mechanical polishing of the metal; and depositing a non-transparent stack of layers onto the metal to cover the under filled array of openings, resulting in an alignment grating comprised of visible indentations in the non-transparent stack of layers.

2. The method of claim 1 wherein the semiconductor device is a Magnetoresistive Random Access Memory.

3. The method of claim 1 wherein the semiconductor device is a metal-insulator-metal capacitor.

4. The method of claim 1 wherein the etching of the trench, and the first and second multiplicity of apertures and array of openings is performed through Reactive Ion Etching.

5. The method of claim 1 wherein the metal used for filling copper.

6. The method of claim 1 wherein the plating metal thickness is about 7500 to about 8500 angstroms.

7. The method of claim 1 wherein said first etch distance is less than the thickness of said second dielectric layer and said second resist layer is patterned such that at least one of said second apertures is defined directly over one of said apertures of said first multiplicity of apertures such that etching said at least one aperture of said second multiplicity of apertures forms a via through the remainder of said second dielectric layer to contact said first layer of metal in said trench.

8. The method of claim 1 wherein said first multiplicity of apertures are located directly over said first layer of metal and said first etch distance extends through said second dielectric layer and forms vias to said first layer of metal and said second etch distance is less than said first etch distance such that said second multiplicity of apertures do not extend through said second layer of dielectric.

9. The method of claim 1 wherein said first multiplicity of apertures are located directly over said first layer of metal and said first etch distance extends through said second dielectric layer and forms vias to said first layer of metal, and said defined second multiplicity of apertures including a first group of apertures and a second group of apertures, said second group being said array of openings such that etching said first group of apertures forms channels that extend less than the thickness of said second dielectric layer and etching said second group of apertures results in said array of openings extending through said second dielectric layer and into said first dielectric layer.

10. The method of claim 1 wherein the formation of the first and second dielectric layers is performed through chemical vapor deposition.

11. The method of claim 10 wherein the chemical vapor deposition is plasma enhanced chemical vapor deposition.

12. The method of claim 1 wherein the first and second dielectric layers are comprised of a low constant dielectric material.

13. The method of claim 12 wherein the low constant dielectric material is chosen from the group consisting of silk, fluorinated oxide, and silicon dioxide.

14. The method of claim 1 wherein the step of filling comprises:

depositing a liner layer into the first and second multiplicity of apertures and the array of openings; and depositing a metal onto the liner layer.

15. The method of claim 14 wherein the liner layer is comprised of tantalum.

16. The method of claim 14 wherein the liner layer is comprised of tungsten nitride.

* * * * *